United States Patent [19]
Gardner

[11] Patent Number: 5,985,743
[45] Date of Patent: Nov. 16, 1999

[54] SINGLE MASK SUBSTRATE DOPING PROCESS FOR CMOS INTEGRATED CIRCUITS

[75] Inventor: Mark I. Gardner, Cedar Creek, Tex.

[73] Assignee: Advanced Micro Devices, Inc., Sunnyvale, Calif.

[21] Appl. No.: 08/715,871

[22] Filed: Sep. 19, 1996

[51] Int. Cl.$^6$ ............................................. H01L 21/265
[52] U.S. Cl. ............................................................ 438/527
[58] Field of Search ................................... 438/514, 517, 438/527, 530, 529, 224, 228

[56] References Cited

U.S. PATENT DOCUMENTS

| | | | |
|---|---|---|---|
| 5,292,671 | 3/1994 | Odanaka | 438/224 |
| 5,384,279 | 1/1995 | Stolmeijer et al. | 438/228 |
| 5,501,993 | 3/1996 | Boreland | 438/228 |
| 5,573,963 | 11/1996 | Sung | 438/228 |
| 5,739,058 | 4/1998 | Karniewicz et al. | 438/529 |
| 5,759,884 | 6/1998 | Youn | 438/228 |
| 5,814,866 | 9/1998 | Boreland | 438/529 |
| 5,821,589 | 10/1998 | Boreland | 438/529 |

OTHER PUBLICATIONS

Wolf, Stanley, Ph.D., Silicon Processing for the VLSI Era, vol. 3; *The Submicron Mosfet*, 1995 by Lattice Press, pp. 432–441.

*Primary Examiner*—Savitri Mulpuri
*Attorney, Agent, or Firm*—Kevin L. Daffer; Conley, Rose & Tayon

[57] ABSTRACT

A method of doping a semiconductor substrate with a single masking step. A semiconductor substrate having a first region and a laterally displaced second region is provided. A patterned masking layer is then formed on an upper surface of the semiconductor substrate over the first region. A first well impurity distribution is then formed in the semiconductor substrate such that a peak concentration of the first well impurity distribution is located at a first well depth below the upper surface in the first region of the semiconductor substrate. The peak concentration of the first well impurity distribution within the second region of the semiconductor substrate is located at a depth approximately equal to the first well depth plus a well displacement. A second well impurity distribution is then formed in the semiconductor substrate. A peak concentration of the second well impurity distribution within the second region of the semiconductor substrate is located at a second well depth below the upper surface. A first adjust impurity distribution is then formed in the semiconductor substrate. A peak concentration of the first adjust impurity distribution within the first region of the semiconductor substrate is located at a first adjust depth below the upper surface of the semiconductor substrate. In the second region of the semiconductor substrate, a peak concentration of the first adjust impurity distribution is located at a depth below the upper surface approximately equal to the first adjust depth plus an adjust displacement. A second adjust impurity distribution is then formed in the semiconductor substrate. A peak concentration of the second adjust impurity distribution within the second region of the semiconductor substrate is located at a second adjust depth below the upper surface.

9 Claims, 3 Drawing Sheets

SINGLE MASK SUBSTRATE DOPING PROCESS FOR CMOS INTEGRATED CIRCUITS

BACKGROUND OF THE INVENTION

1. Field of the Invention

The invention relates to the field of semiconductor processing and more particularly to the process of doping the substrate of a CMOS integrated circuit.

2. Description of the Relevant Art

In complimentary metal-oxide-semiconductor (CMOS) integrated circuits, in which n-channel and p-channel transistors are fabricated in a single semiconductor substrate, threshold voltage and drain current are controlled through a number of interrelated process steps. The resistivity of the starting material and the subsequent doping of the starting material result in a substrate doping profile that, together with the thickness of the gate oxide, the quantity of charged sites within the gate oxide, and other variables, determine the threshold voltage and other critical operating parameters of the integrated circuit.

In a twin-well CMOS process, an n-well and a p-well are formed in the substrate with an n-type and a p-type dopant respectively. Early twin-well processes used two masking steps to form the wells. One of the masking steps prevented the n-type dopant from entering the p-well during formation of the n-well while the other masking step prevented the p-type dopant from entering the n-well during the formation of the p-well. A single-mask well formation process was developed to reduce the demands on expensive photolithography equipment. In such a process, the single masking step is used to pattern a silicon nitride layer on the semiconductor surface to expose the first well region. After the first well dopant is introduced into the first well region, a thermal oxidation is performed to grow a "well oxide" over the first well region while the nitride film prevents the growth of a significant oxide film over the second well region. The well oxide serves as a blocking layer over the first well region. The nitride film is thereafter removed, the second dopant introduced into the second well region, and, finally, the well oxide is stripped from the wafer. See, e.g., 2 S. Wolf, *Silicon Processing for the VLSI Era,* 432–33 (Lattice Press 1990) [hereinafter Wolf]. Despite eliminating a masking step, the single mask process described results in a non-planar substrate upper surface because the well oxidation process consumes a portion of the substrate in the first well region of the substrate thereby creating a "step" at the interface of the n-well and p-well regions. Non-planar surfaces increase the complexity of subsequent processing steps, including the patterning and etching of fine line interconnects. Such interconnects tend to undesirably "notch" over steps in the underlying topography creating localized regions of potentially high current density and, consequently, reduced reliability. See, e.g., 1 Wolf at 437–41 (Lattice Press 1986).

After the formation of the wells, the substrate is further selectively doped to minimize punchthrough subthreshold currents, increase the channel stop doping, and to adjust the threshold voltages to desirable levels. Each of these steps may require its own pair of masking steps and, accordingly, may still further increase the demands on the photolithography equipment. The two-mask threshold adjust process cannot typically be circumvented with a nitride mask/thermal oxidation substitute as described above because the high temperature oxidation cycle would undesirably drive the first threshold impurity into the substrate away from the substrate upper surface. Thus, a conventional substrate doping sequence in a twin-well CMOS process includes a minimum of three masking steps and results in a non-planar step at the interface of the two well regions. It would be highly desirable to implement a process for doping the substrate of a semiconductor device requiring a single masking step and producing a substantially planar substrate upper surface.

SUMMARY OF THE INVENTION

The problems identified above are addressed in large part by a process for doping the substrate of a CMOS semiconductor device, in conjunction with a high energy implanter. With the use of an appropriate masking layer, the high energy implanter can produce an impurity distribution within the semiconductor substrate in which a peak concentration of the distribution is situated at a desirable level within one region of the semiconductor substrate and situated in an electrically isolated region deep below the upper surface of the substrate in another region. In this manner, the p-well and n-well regions of a CMOS semiconductor substrate can be selectively doped with a single masking step and without the use of a thermal oxidation mask.

Broadly speaking, the present invention contemplates a method of doping a semiconductor substrate with a single masking step. A semiconductor substrate having a first region and a second region is provided. The first region and the second region of the semiconductor substrate are laterally displaced from each other. A patterned masking layer is then formed on an upper surface of the semiconductor substrate over the first region. A first well impurity distribution is then formed in the semiconductor substrate such that a peak concentration of the first well impurity distribution is located at a first well depth below the upper surface in the first region of the semiconductor substrate. The peak concentration of the first well impurity distribution within the second region of the semiconductor substrate is located at a depth approximately equal to the first well depth plus a well displacement. A second well impurity distribution is then formed in the semiconductor substrate. A peak concentration of the second well impurity distribution within the second region of the semiconductor substrate is located at a second well depth below the upper surface. The patterned masking layer prevents the second well impurity distribution from substantially entering the first region of the semiconductor substrate. A first adjust impurity distribution is then formed in the semiconductor substrate. A peak concentration of the first adjust impurity distribution within the first region of the semiconductor substrate is located at a first adjust depth below the upper surface of the semiconductor substrate. In the second region of the semiconductor substrate, a peak concentration of the first adjust impurity distribution is located at a depth below the upper surface approximately equal to the first adjust depth plus an adjust displacement. A second adjust impurity distribution is then formed in the semiconductor substrate. A peak concentration of the second adjust impurity distribution within the second region of the semiconductor substrate is located at a second adjust depth below the upper surface. The patterned masking layer prevents the second adjust impurity distribution from substantially entering the second region of the semiconductor substrate.

In a presently preferred embodiment, the steps of forming the first well impurity distribution, the second well impurity distribution, the first adjust impurity distribution, and the second adjust impurity distribution all contemplate the use of ion implantation. Preferably, a first well impurity, a second well impurity, a first adjust impurity, and a second adjust impurity are implanted at a first well energy, a second well energy, a first adjust energy, and a second adjust energy respectively, to form the respective impurity distribution. In the preferred embodiment, the first well energy is greater than the second well energy while the first adjust energy is greater than the second adjust energy. Preferably, the first well energy and the first adjust energy are approximately equal to 0.5 MeV to 3 MeV.

In one embodiment, the method further includes forming a first punchthrough impurity distribution in the semiconductor substrate such that a peak concentration of the first punchthrough impurity distribution within the first region of the substrate is located at a first punchthrough depth below the upper surface. A peak concentration of the first punchthrough impurity distribution within the second region of the substrate is located at a depth below the upper surface approximately equal to the first punchthrough depth plus a punchthrough displacement. In this embodiment, a second punchthrough impurity distribution is formed in the substrate such that a peak concentration of the second punchthrough impurity distribution within the second region is located at a second punchthrough depth below the upper surface. The patterned masking layer prevents the second punchthrough impurity distribution from substantially entering the second region of the semiconductor substrate. Preferably, the steps of forming the first punchthrough impurity distribution and the second punchthrough impurity distribution contemplate ion implanting a first punchthrough impurity and a second punchthrough impurity into the semiconductor substrate at a first punchthrough energy and a second punchthrough energy, respectively. Preferably, the first punchthrough energy is greater than the second punchthrough energy and the first punchthrough energy is approximately equal to 0.5 MeV to 3 MeV.

In one embodiment, the patterned masking layer is comprised of photoresist having a thickness of approximately 0.5 to 5.0 microns. In another embodiment, the patterned masking layer comprises a masking dielectric having a thickness of approximately 0.5 to 5.0 microns. The masking dielectric may alternatively be comprised of oxide or silicon nitride or some combination thereof.

In one embodiment of the present invention in which the patterned masking layer comprises a dielectric, the method further includes the step of driving in the first and second well impurity distribution with a tube anneal at a temperature of approximately 900–1100° C. for a duration of approximately 30–700 minutes. The drive-in step preferably follows the formation of the first well impurity distribution and the second well impurity distribution and proceeds the formation of the first adjust impurity distribution and the second adjust impurity distribution. In another embodiment, the tube anneal drive in step may be replaced with a 10 to 60 second rapid thermal anneal process to electrically activate the impurity distributions without significantly redistributing them.

In one embodiment, the first region of the semiconductor substrate is the p-well region while the second region of the substrate is the n-well region. In this embodiment, the first well impurity preferably comprises boron, the second well impurity preferably comprises phosphorus, the first adjust impurity preferably comprises boron, and the second adjust impurity preferably comprises boron. In an alternative embodiment, the first region of the substrate is the n-well region while the second region of the substrate is the p-well region.

The present invention further contemplates a semiconductor substrate for a CMOS integrated circuit. The substrate includes a first well impurity distribution having a peak concentration located at a first well depth below an upper surface of the substrate within a first region of the semiconductor substrate and having a peak concentration within a second region of the substrate located at a depth below the upper surface approximately equal to the first well depth plus a well displacement. The second region is laterally displaced from the first region. The substrate further includes a second well impurity distribution substantially confined to the second region of the semiconductor substrate. A peak concentration of the second well impurity distribution is located at a second well depth below the upper surface. A first adjust impurity distribution has a peak concentration located at a first adjust depth below the upper surface within a first region of the substrate and a peak concentration within a second region of the substrate located at a depth below the upper surface approximately equal to the first adjust depth plus an adjust displacement. A second adjust impurity distribution substantially confined to the second region of the substrate has a peak concentration located a second adjust depth below the upper surface.

Preferably, the well displacement is such that the first well impurity distribution is electrically isolated from the second well impurity distribution within the second region of the substrate while the second adjust displacement is such that the first adjust impurity distribution is electrically isolated from the second adjust impurity distribution within the second region of the substrate. In the presently preferred embodiment, the first well impurity distribution comprises ions of boron, the second well impurity distribution comprises ions of phosphorus, the first adjust impurity distribution comprises ions of boron, and the second adjust impurity distribution comprises ions of boron.

In one embodiment of the semiconductor substrate, a first punchthrough impurity distribution having a peak concentration located a first punchthrough depth below an upper surface of the substrate is located within the first region of the substrate. A peak concentration of the first punchthrough impurity distribution within the second region of the substrate is located at a depth below the upper surface approximately equal to the first punchthrough depth plus a punchthrough displacement. In this embodiment, a second punchthrough impurity distribution is substantially confined to the second region of the substrate. A peak concentration of the second punchthrough impurity distribution is located a second punchthrough depth below the upper surface. Ideally, the punchthrough displacement is such that the first punchthrough impurity distribution is electrically isolated from the second punchthrough impurity distribution within the second region of the semiconductor substrate.

BRIEF DESCRIPTION OF THE DRAWINGS

Other objects and advantages of the invention may become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE INVENTION

Figure 1:
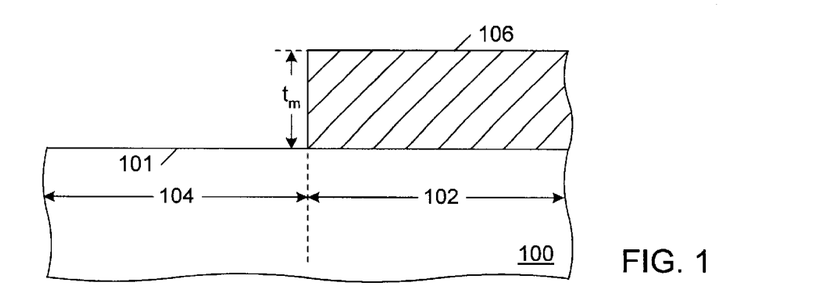
FIG. 1 is a part 1 cross-sectional view of a semiconductor substrate upon which a patterned masking layer has been formed.

Turning now to the drawings, alternative processing sequences according to the present invention are displayed. FIG. 1 is a partial cross-sectional view of semiconductor substrate 100. Preferably, semiconductor substrate 100 is a single crystal silicon substrate. In a preferred embodiment, substrate 100 includes a heavily doped p+ bulk (not shown in the drawing) upon which a p-epitaxial layer has been formed. Preferably, the epitaxial layer has a resistivity of approximately 10–15 Ω-cm. Semiconductor substrate 100 comprises first region 102 laterally displaced from second region 104. Patterned blocking layer 106 has been formed upon upper surface 101 of substrate 100. Patterned blocking layer 106 may be comprised simply of photoresist. In such an embodiment, patterned blocking layer 106 is formed with conventional photolithography and photoresist processing steps. In a preferred embodiment, patterned blocking layer 106 has a thickness of approximately 0.5 to 5.0 microns. One embodiment of the present invention contemplates the use of high energy implant apparatus to introduce an impurity distribution into a semiconductor substrate such that peak concentrations of the impurity distribution are located at variable depths dependent upon the position within semiconductor substrate 100. In such an embodiment, the use of patterned blocking layer 106 facilitates this goal by providing a material through which the high energy ions must pass before entering first region 101 of substrate 100. Ions that must traverse patterned blocking layer 106 prior to entering substrate 100 will lose energy traveling through the blocking layer and will thus arrive at upper surface 101 of substrate 100 with less energy than ions that collide directly with upper surface 101. In this manner, the peak concentration of the impurity distribution below the patterned blocking layer will be displaced from the peak concentration of the impurity distribution within regions of substrate 100 not covered by patterned blocking layer 106. The displacement will vary with the thickness $t_m$ of patterned blocking layer 106.

In an alternative embodiment, patterned blocking layer 106 may be comprised of a dielectric material such as chemically vapor deposited oxide or silicon nitride or, possibly, a combination of both. A dielectric may be desirable in an embodiment in which it is desired to subject the first and second well impurity distributions (as described below) to a high temperature thermal process such as a tube anneal drive-in step, or a rapid thermal anneal. Conventional photoresist material may not be able withstand the high temperatures of such a cycle and, therefore, if it is desired to minimize the number of photolithography steps, a dielectric material may be substituted for the photoresist material in patterned blocking layer 106.

Figure 2:
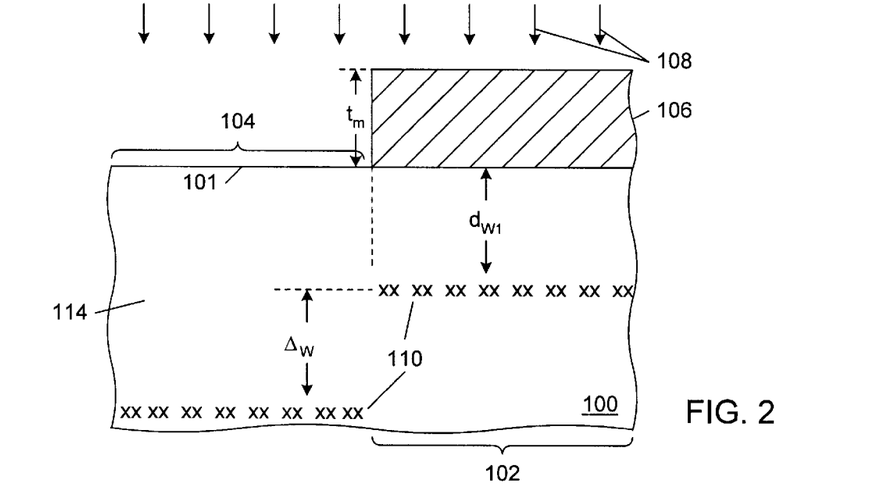
FIG. 2 is a processing step subsequent to FIG. 1, in which a first well impuritydistribution has been introduced into the substrate.

FIG. 2 shows a subsequent processing step in which a first well impurity distribution 110 is introduced in the semiconductor substrate 100. First well impurity distribution 110 is introduced such that a peak concentration value (shown by the x's in the drawing) is located a first well depth $d_{w1}$ below upper surface 101 of semiconductor substrate 100 within first region 102. A peak concentration of first well impurity distribution 110 within second region 104 of semiconductor substrate 100 is located a depth below upper surface 101 approximately equal to the first well depth $d_{w1}$ plus a well displacement $\Delta_w$. Preferably, first impurity distribution 110 is introduced into semiconductor substrate 100 through the use of a first well implantation step depicted as reference numeral 108 in the drawing. The present invention contemplates selectively doping a substrate of a CMOS integrated circuit with a minimum of masking steps. To ensure that the portion of first well impurity distribution 110 within second region 104 of semiconductor substrate 100 does not influence the performance of transistors subsequently formed in second region 104, the peak concentration of first impurity distribution 110 in second region 104 must be located at a depth sufficient to ensure that the surface characteristics of substrate 100 near upper surface 101 are substantially unaffected by the presence of first impurity distribution 110. To ensure an adequate depth, the use of a high energy implant process is preferred. The advent of high energy implanters (i.e., implanters operating at an energy $\geq 0.5$ MeV) facilitates achieving the desired goal. The first well implant 108 is carried out at an implant energy of approximately 0.5 MeV to 3 MeV whereby a peak concentration of first well impurity distribution within second region 104 of semiconductor substrate 100 will be located at a depth below upper surface 101 sufficiently great such that the presence of first impurity distribution 110 within second region 104 of semiconductor substrate does not substantially affect the electrical characteristics of semiconductor substrate 100 proximal to upper surface 101. First well depth $d_{w1}$ is adjusted by varying the thickness $t_m$ of patterned blocking layer 106.

Figure 3:
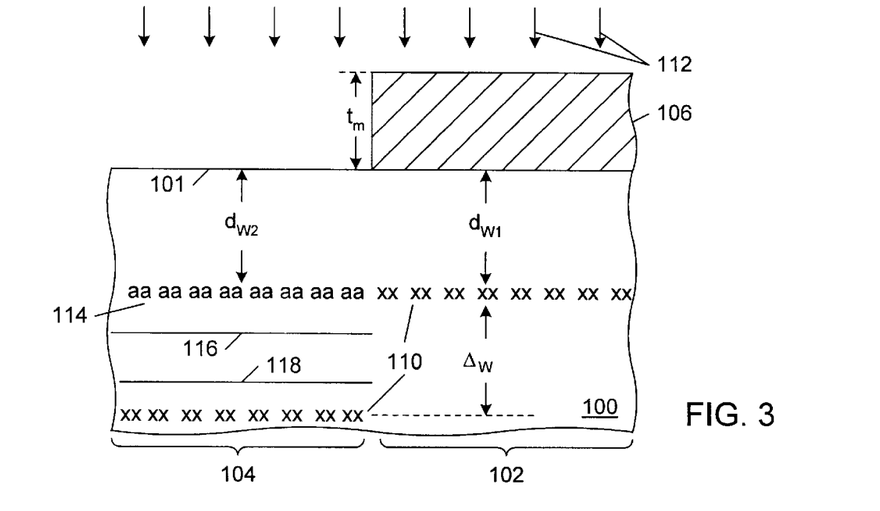
FIG. 3 is a processing step subsequent to FIG. 2, in which a second well impurity distribution has been introduced into the substrate.

FIG. 3 shows a subsequent processing step in which second well distribution 114 is introduced into semiconductor substrate 100. A peak concentration of second well distribution 114 (denoted by the "a's" in the drawing) is located a second well depth $d_{w2}$ below upper surface 101 of semiconductor substrate 100. Preferably, the introduction of second well distribution 114 into semiconductor substrate 100 is accomplished with second well ion implantation step 112. In the presently preferred embodiment, the energy of second ion implantation 112 is sufficiently low such that patterned blocking layer 106 effectively prevents second well impurity distribution 114 from entering first region 102 of semiconductor substrate 100. In a presently preferred embodiment, an energy of second well implant 112 is approximately 20 KeV to 500 KeV. To successfully accomplish the introduction of first well implant distribution 110 and second well implant distribution 114 into semiconductor substrate 100 using a single masking step, a peak concentration of first well implant distribution 110 within second region 104 must be located at a depth sufficient to electrically isolate first well implant distribution 110 from second well implant distribution 114 in second region 104 of semiconductor substrate 100. As is well known in the field of semiconductor processing, implant impurity distributions such as second well impurity distribution 114 include a peak concentration typically located approximately at a midpoint of the impurity distribution and an impurity gradient such that the impurity concentration drops above and below the peak concentration value. It is further known that impurity distributions created by ion implantation drop off exponentially from the peak concentration value. Shown in FIG. 3 is a lower boundary 116 of second well impurity distribution 114 and an upper boundary 118 of first well impurity distribution 110 within second region well 4 of semiconductor substrate 100. Lower boundary 116 and upper boundary 118 represent approximate locations of their respective impurity distributions where the instantaneous impurity concentration is less than 10% of the peak concentration. For purposes of this disclosure, first impurity distribution 110 within second region 104 of semiconductor substrate 100 is considered to be electrically isolated from second well impurity distribution 114 when upper boundary 118 of first well impurity distribution 110 is below lower boundary 116 of second well impurity distribution 114 within second region 104 of semiconductor substrate 100.

It will be appreciated that, in alternative embodiments, first region 102 may comprise either a p-well or an n-well region and that, in either embodiment, second region 104 comprises a well region of conductivity type opposite to that of first region 102. Similarly, it will be appreciated that subsequently formed transistors in first region 102 and second region 104 are of opposite conductivity or channel type as is well known in the CMOS process and circuit design. In an embodiment in which first region 102 is the p-well region, the preferred dopant for first well impurity distribution 110 is phosphorus while the preferred dopant for second well impurity distribution 114 is boron. At the preferred energies of first well implant 108 (i.e., 0.5 MeV to 3 MeV) a peak concentration of first well impurity distribution 110 within second region 104 is ideally located at a depth greater than approximately 1.5 microns to allow sufficient room for the formation of second well impurity distribution 114.

Figure 4:
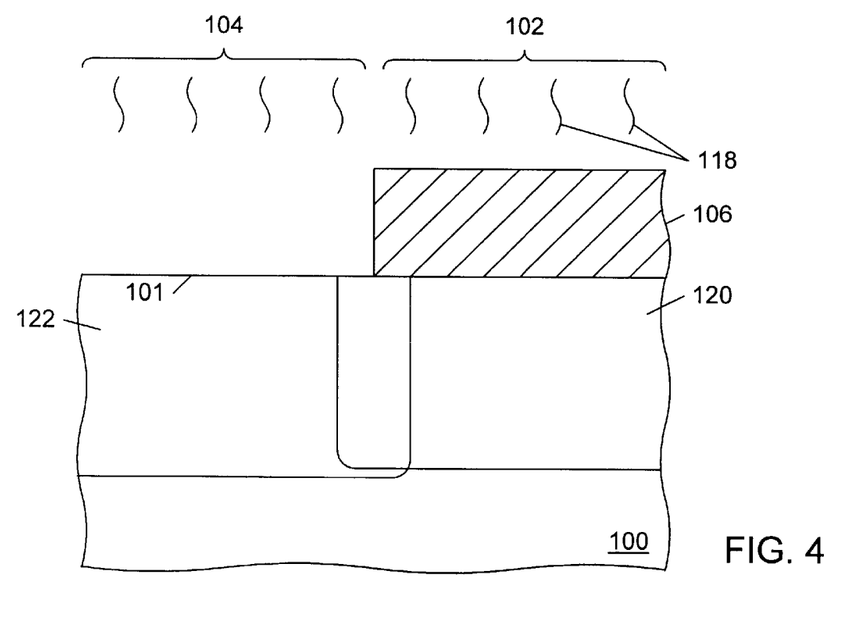
FIG. 4 is an optional processing step subsequent to FIG. 3, in which the first well impurity distribution and the second well impurity distribution are driven in to the substrate.
Figure 5:
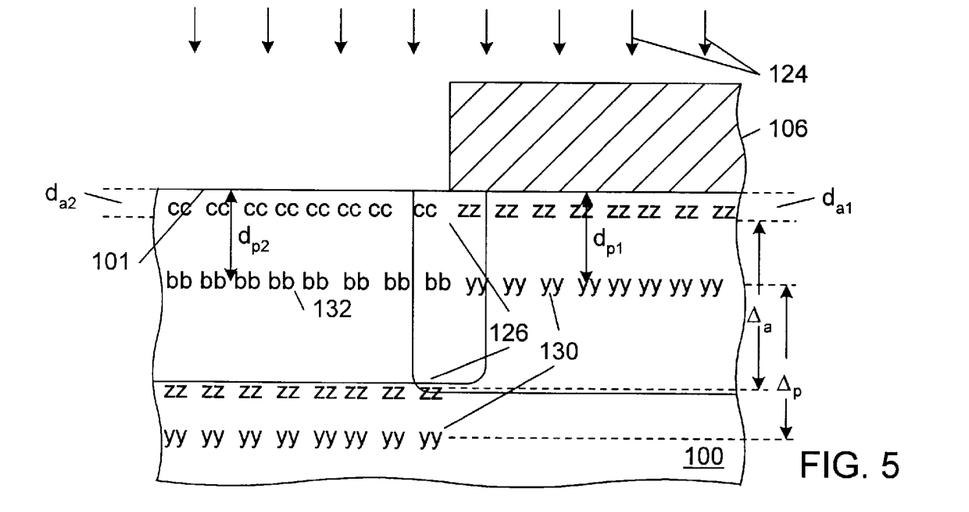
FIG. 5 is a processing step subsequent to FIG. 4, in which first and second adjust impurity distributions and first and second punchthrough impurity distributions have been introduced into the substrate.

FIGS. 4 and 5 show an optional processing sequence in which the well impurity distributions 110 and 114 are subjected to a thermal process 118 prior to the introduction of threshold adjust and (possibly) punchthrough impurity distributions. Because the thickness $t_m$ of patterned dielectric 106 is easily adjusted, it is contemplated that the present processing sequence may be achieved without the use of a high temperature drive in step typically associated with the formation of CMOS wells. It is understood, however, that a well drive-in step, preferably comprised of a tube-type anneal, may be performed prior to the introduction of any threshold adjust or punchthrough implants. In an embodiment in which thermal process 118 is a tube anneal, thermal process 118 drives first well impurity distribution 110 and second well impurity distribution 114 into first well region 120 and second well region 122, respectively, of semiconductor substrate 100. In this embodiment, thermal process 118 redistributes first impurity distribution 110 and second impurity distribution 114 and decreases the concentration gradient of the respective impurity distributions within semiconductor substrate 100. Such a drive-in step may be desirable in a processing sequence to achieve a relatively uniform vertical doping profile within first well region 120 and second well region 122. In one such drive-in step, thermal process 118 comprises subjecting semiconductor substrate 100 to an inert ambient at a temperature of approximately 700–1100° C. for a duration of approximately 30–700 minutes. The inert ambient prevents the formation of a significant dielectric layer at upper surface 101 of semiconductor substrate 100. It will be understood by those skilled in the art that thermal process 118 subjects patterned masking layer 116 to high temperature processing and, therefore, may be incompatible with the presence of photoresist upon semiconductor substrate 100. Accordingly, patterned masking layer 106 preferably comprises a dielectric material such as a CVD oxide or silicon nitride in embodiments of the present invention that include thermal step 118.

In an alternative embodiment, thermal process 118 is a rapid thermal anneal (RTA) comprised of subjecting semiconductor substrate 100 to a temperature of approximately 700–1100 ° C. for a duration of 10 to 60 seconds. An RTA embodiment of thermal process 118 may be advantageously employed to electrically activate the impurities of first well impurity distribution 110 and second well impurity distribution 114 without effecting a significant redistribution of the respective impurity distributions. See, 1 Wolf at 303–07.

FIG. 5 shows a processing step subsequent to FIG. 4 after a series of processing steps in which first adjust impurity distribution 126, second adjust impurity distribution 128, first punchthrough impurity distribution 130, and second punchthrough impurity distribution have been introduced into semiconductor substrate 100. First adjust impurity distribution 126 is such that a peak concentration (represented by the "z's" in FIG. 4) is located at a first adjust depth $d_{a1}$ below upper surface 101 of semiconductor substrate 100 within first region 102. A peak concentration value of first adjust impurity distribution 126 within second region 104 of semiconductor substrate 100 is located at a depth below upper surface 101 approximately equal to first adjust depth $d_{a1}$ plus adjust displacement $\Delta_a$. Second adjust impurity distribution 128 has a peak concentration (represented by the "c's" in FIG. 4) located a second adjust depth $d_{a2}$ below upper surface 101 within second region 104 of semiconductor substrate 100. Patterned masking layer 106 substantially prevents the introduction of second adjust impurity distribution 128 from forming in first region 102 of semiconductor substrate 100. The introduction of first adjust impurity distribution 126 and second adjust impurity distribution 128 into semiconductor substrate 100 is preferably accomplished with a pair of ion implantation steps represented by reference numeral 124 in the drawing. The first adjust implant is preferably carried out with an implant energy of approximately 0.5 MeV to 3 MeV such that a peak concentration of first adjust impurity distribution 128 within second region 104 of semiconductor substrate 100 is located at a depth of greater than approximately 1.5 microns. A second adjust implant used to introduce second adjust impurity distribution 128 into second region 104 of semiconductor substrate 100 is preferably carried out at an implant energy of approximately 20–500 KeV.

First adjust impurity distribution 126 and second adjust impurity distribution 128 are preferably introduced into semiconductor substrate 100 such that first adjust depth $d_{a1}$ and second adjust depth $d_{a2}$ are less than approximately 0.2 microns and, as their name implies, are used to adjust the threshold value of subsequently formed transistors. Ideally, the threshold values of transistors formed within first region 102 and second region 104 are approximately equal in absolute value and are made as close to 0 volts as possible without incurring substantial subthreshold currents. In an embodiment of the present invention in which first region 102 represents the p-well region, first adjust impurity distribution 126 is designed to raise the absolute value of the n-channel threshold voltage to a voltage sufficient to suppress significant subthreshold leakage (e.g., to a value of approximately 100–700 mV.) Accordingly, first adjust impurity distribution 126 typically comprises boron in this preferred embodiment. In an embodiment in which second region 104 of semiconductor substrate 100 serves as the n-well region of the CMOS semiconductor, second adjust impurity distribution 128 increases the absolute value of the p-channel threshold voltage. Accordingly, second adjust impurity distribution 128 also preferably comprises boron.

Boundaries of first adjust impurity distribution 126 and second adjust impurity distribution 128 (such as are shown with respect to first and second well impurity distributions 110 and 114, respectively, in FIG. 3) are eliminated from FIG. 5 to simplify the drawing. The present invention contemplates that first adjust impurity distribution 126 is introduced into semiconductor substrate 100 in a manner such that an upper 10% boundary of first adjust impurity distribution 126 is below a lower 10% boundary of second adjust impurity distribution 128 such that second adjust impurity distribution 128 is electrically isolated from first adjust impurity distribution 126 within second region 104 of semiconductor substrate 100. To achieve this objective, the present invention contemplates that a peak concentration of first adjust impurity distribution 126 within second region 104 of semiconductor substrate 100 is located at a depth below upper surface 101 of semiconductor substrate 100 greater than approximately 1.5 microns. The thickness $t_m$ and material of patterned blocking layer 106 and the energy at which first adjust impurity distribution 126 is implanted into semiconductor substrate 100 in the preferred embodiment are adjusted such that the first adjust depth $d_{a1}$ is preferably less than approximately 0.2 microns.

The introduction of first punchthrough impurity distribution 130 and second punchthrough impurity distribution 132 as shown in FIG. 5 is optional. In an embodiment in which it is desired to reduce subthreshold currents due to punchthrough effects (See 2 Wolf at 341–45), a first punchthrough impurity distribution 130 and a second punchthrough impurity distribution 132 may be introduced into first and second regions 102 and 104, respectively, of semiconductor substrate 100. In an embodiment in which first region 102 serves as the p-well region, first punchthrough impurity distribution 130 preferably comprises boron. Similarly, in an embodiment in which second region 104 of semiconductor substrate 100 is the n-well region, second punchthrough impurity distribution 132 preferably comprises phosphorus. Once again, to achieve adequate separation in second region 104 of semiconductor substrate 100 between first punchthrough impurity distribution 130 and second punchthrough impurity distribution 132, the energy at which first punchthrough impurity distribution 130 is implanted into semiconductor substrate 100 in the preferred embodiment, it is preferably between approximately 0.5 MeV and 3 MeV. Adequate electrical isolation between first punchthrough impurity distribution 130 and second punchthrough impurity distribution 132 within second region 104 of semiconductor substrate 100 is achieved, for purposes of this invention, when the 10% lower boundary of second punchthrough impurity distribution 132 is above the upper 10% boundary of first impurity distribution 126 similar to the manner in which the other impurity distributions are isolated as previously discussed. A peak concentration value of first punchthrough impurity distribution 130 is preferably located a first punchthrough depth $d_{p1}$ below upper surface 101 of semiconductor substrate 100 in first region 102 of semiconductor substrate 100. A peak concentration value of first impurity distribution 130 within second region 104 of semiconductor substrate is located at a depth below upper surface 101 approximately equal to the first punchthrough depth $d_{p1}$ plus a punchthrough displacement $\Delta_p$. A peak concentration of second punchthrough impurity distribution 132 is located a second punchthrough depth $d_{p2}$ below upper surface 101 of semiconductor substrate 100. It is understood, that reference numeral 124 refers to multiple implants in the preferred embodiment used to introduce the multiple impurity distributions into semiconductor substrate 100.

Figure 6:
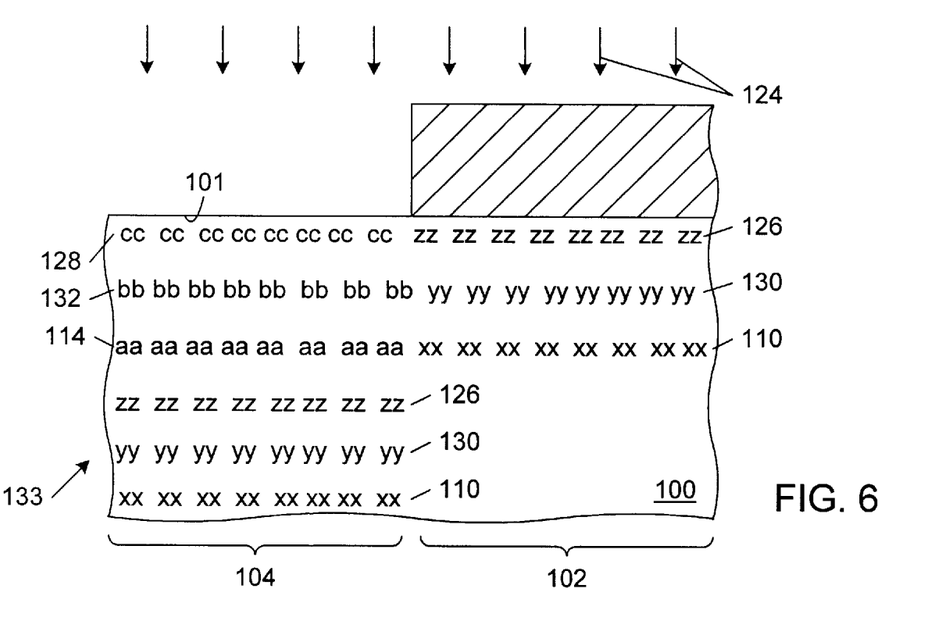
FIG. 6 is a processing step subsequent to FIG. 3, in which first and second adjust impurity distributions and first and second punchthrough impurity distributions have been introduced into the substrate.

FIG. 6 is a partial cross-sectional view of a processing step subsequent to FIG. 3. In this embodiment of the present process, no drive-in step is performed after the formation of first well impurity distribution 110 and second well impurity distribution 114. In this embodiment, first well impurity distribution 110, second well impurity distribution 114, first adjust impurity distribution 126, second adjust impurity distribution 128, and, optionally, first and second punchthrough impurity distributions 130 and 132, respectively, are introduced into semiconductor substrate 100, preferably without an intervening high temperature or annealing step. By eliminating high temperature processing from this embodiment, patterned masking layer 106 may simply be comprised of photoresist. It will be understood that reference numeral 124 refers to the entire sequence of steps used to introduce the described impurity distributions into semiconductor substrate 100. It is also understood that the sequence of implant steps is but one preferred sequence. Alternative implant sequences can be accommodated within the scope of the present invention. As an example, in an embodiment in which semiconductor substrate 100 includes a first punchthrough impurity distribution 130 and a second punchthrough impurity distribution 132, first and second adjust impurity distributions 126 and 128 may be introduced into substrate 100 either before or after the punchthrough impurity distributions. Similarly, in the embodiment shown in FIG. 6 in which first and second well implants 110 and 114, respectively, are not subjected to a high temperature drive-in step 118 as shown in FIG. 4, the introduction of the well implant distributions may occur either before or after the introduction of the threshold adjust impurity distributions. The threshold adjust impurity distributions are, however, preferably introduced into semiconductor substrate after the other impurity distributions have been introduced.

Thus, FIG. 6 depicts a semiconductor substrate 133 for use with CMOS integrated circuit. Substrate 133 includes a first well impurity distribution 110. A peak concentration of first well 110 is located at a first well depth $d_{w1}$ (as shown in FIG. 2) below upper surface 101 in first region 102 of semiconductor substrate 100. A peak concentration of first well impurity distribution 110 within second region 104 of semiconductor substrate 100 is located a well displacement $\Delta_w$ below the peak concentration of first well impurity distribution 110 within first region 102 of semiconductor substrate 100. Substrate 133 further includes a second well impurity distribution 114. A peak concentration of second well impurity distribution 114 is located a second well depth $d_{w2}$ (shown in FIG. 3) below upper surface 101 within second region 104 of semiconductor substrate 100. Second impurity distribution 114 is substantially non-existent within first region 102 of semiconductor substrate 100. A peak concentration of first well impurity distribution 110 within second region 104 of semiconductor substrate 100 is substantially below a peak concentration of second well impurity distribution 114 such that second impurity distribution 114 is electrically isolated from first well impurity distribution 110 within second region 104. Second well impurity distribution 114 is considered to be electrically isolated from well impurity distribution within second region 104 of semiconductor substrate 100 when a lower 10% boundary of second well impurity distribution 114 is above an upper 10% boundary of first well impurity distribution 110 within second region 104. Substrate 133 further includes a first adjust impurity distribution 126. A peak concentration of first adjust impurity distribution 126 within first region 102 of semiconductor substrate 100 is located a first adjust depth $d_{a1}$ below upper surface 101 of semiconductor substrate 100. A peak concentration value of first adjust impurity distribution 126 within second region 104 of semiconductor substrate 100 is located a depth below upper surface 101 approximately equal to first adjust depth $d_{a1}$ plus an adjust displacement $\Delta_a$. A second adjust impurity distribution 128, substantially confined to second region 104 of semiconductor substrate 100, has a peak concentration value located a second adjust depth $d_{a2}$ below upper surface 101 (as shown in FIG. 5). A peak concentration of first adjust impurity distribution 126 within second region 104 of semiconductor substrate 100 is substantially below a peak concentration of second adjust impurity distribution 128 such that first adjust impurity distribution and second adjust impurity distribution are electrically isolated within second region 104. The distribution regions are considered to be electrically isolated for purposes of this disclosure when a lower 10% boundary of second adjust impurity distribution 128 is above an upper 10% boundary of first adjust impurity distribution 126 within second region 104. Semiconductor substrate 133 may further include a first punchthrough impurity distribution 130 and a second punchthrough impurity distribution 132. First punchthrough impurity distribution 130 has a peak concentration located a first punchthrough depth $d_{p1}$ below upper surface 101 of semiconductor substrate 100 within first region 102 as shown in FIG. 5. A peak concentration of first punchthrough impurity distribution 130 within second region 104 of semiconductor substrate 100 is located a depth below upper surface 101 approximately equal to the first punchthrough depth $d_{p1}$ plus a punchthrough displacement $\Delta_p$. Second punchthrough impurity distribution 132 is substantially confined to second region 104 of semiconductor substrate 100. A peak concentration of second impurity distribution 132 is located a second punchthrough depth $d_{p2}$ below upper surface 101 of semiconductor substrate 100. In a manner similar to the electric isolation of the well impurity distributions and the adjust impurity distributions, first punchthrough impurity distribution 130 is electrically isolated from second punchthrough impurity distribution 132 within second region 104 of semiconductor substrate 100.

It will be appreciated that, although first well impurity distribution 110, first adjust impurity distribution 126, and first punchthrough impurity distribution 130 are depicted as discrete layers in FIG. 6, the respective 10% boundaries of these impurities distribution may overlap within first region 102 of semiconductor substrate 100. Similarly, the 10% boundaries of second well impurity distribution 114, second adjust impurity distribution 128, and second punchthrough impurity distribution 132 may overlap within second region 104 of semiconductor substrate 100.

Figure 7:
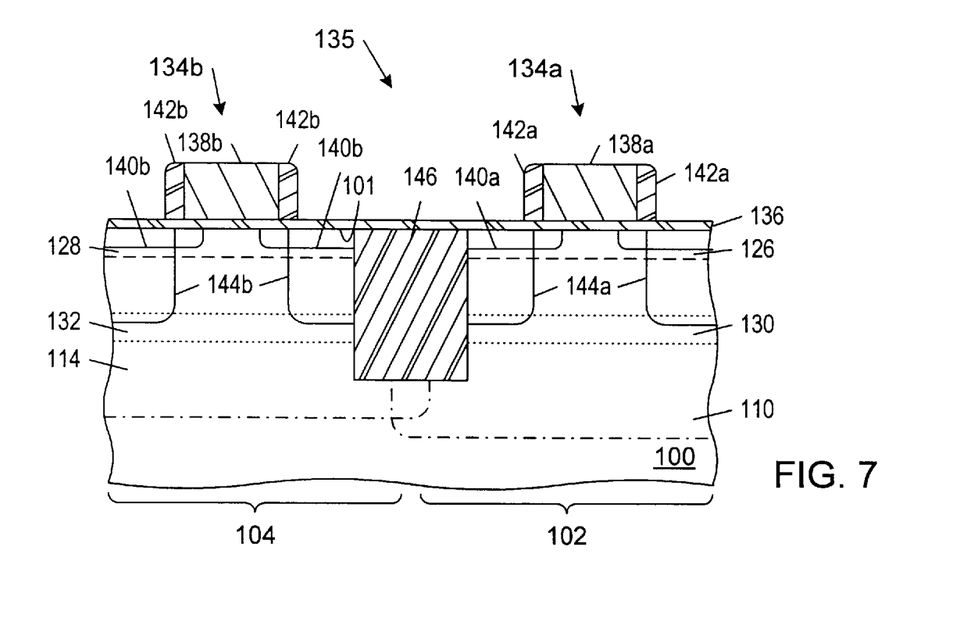
FIG. 7 is a processing step subsequent to FIG. 5 or 6, in which a pair of transistors and an isolation structure have been formed in the semiconductor substrate.

FIG. 7 shows a processing step subsequent to either FIG. 5 or FIG. 6 in which first transistor 134a and second transistor 134b have been formed in first region 102 and second region 104, respectively, of semiconductor substrate 100 to form CMOS integrated circuit 135. Each transistor 134 includes a gate dielectric 136 upon which a conductive gate structure 138 has been formed. Preferably, gate dielectric 136 represents a thermally grown oxide having a thickness of approximately 20–200 angstroms. Conductive gate structure 138 in the preferred embodiment is formed of heavily doped polysilicon (i.e., polysilicon having a sheet resistivity less than approximately 500 Ω/sq.). In an embodiment in which first region 102 of semiconductor substrate 100 represents the p-well region, first conductive gate structure 138 is heavily doped with an n-type dopant such as phosphorus or arsenic while second conductive gate structure 138b formed in the n-well region comprises a p-type heavily doped polysilicon. Transistors 134 further include source/drain regions 140 and 144. As will be appreciated to those skilled in the art, source/drain region 140 represents a lightly doped drain impurity distribution used to reduce the maximum electric field within semiconductor substrate 100 proximal to upper surface 101 to minimize the injection of hot electrons into substrate 100 from the heavily doped source/drain region 144. Spacer structures 142 are shown formed on sidewalls of conductive gate structure 138 and are used in conjunction with a process for forming LDD regions 140 and heavily doped regions 144 as is well known in the field. See, e.g., 2 S. Wolf, at 344–359. Integrated circuit 135 further includes an isolation structure 146 laterally disposed between first transistor 134a and second transistor 134b. Isolation structure 146 comprises a dielectric material and serves to electrically isolate source/drain regions of adjacent transistors such as first source/drain region 144a and second source/drain region 144b. Isolation structure 146 shown in the drawing comprises a shallow trench isolation structure. Shallow trench isolation structures are formed by etching a trench shaped void into an upper surface of semiconductor substrate 100, filling the trench with a dielectric material such as a CVD oxide, and removing portions of the dielectric material exterior to the isolation trench. A shallow trench isolation structure may be formed either prior to the sequence of processing steps shown in FIGS. 1–6 or after the processing sequences of either FIG. 5 or FIG. 6 but prior to the formation of isolation dielectric 136. It will be appreciated to those skilled in the art that alternative isolation structures such as the conventional local oxidation (LOCOS) may be used. A LOCOS isolation structures is preferably formed prior to the processing shown in FIG. 1 by selectively oxidizing isolation regions of semiconductor substrate 100. The selective oxidation of semiconductor substrate 100 is preferably achieved by thermally oxidizing the silicon substrate in the presence of a patterned silicon nitride mask that retards the thermal oxidation in the selected regions of the semiconductor substrate. The LOCOS isolation structure has the dual disadvantages of resulting in a non-planar surface due to the tendency of the thermal oxide to extend in both directions from upper surface 101 as well as the encroachment into the active regions caused by the familiar bird's beak structure that tends to form at the boundaries of the patterned silicon nitride layer in the preferred embodiment.

It will be appreciated to those skilled in the art having the benefit of this disclosure that this invention is capable of simplifying the process for doping the substrate of an integrated circuit. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A method of doping a semiconductor substrate with a single masking step, comprising:

provinding the semiconductor substrate, wherein sad semiconductor substrate comprises a first region and a second region laterally displaced from said first region;

forming a patterned dielectric masking layer selected from the group consisting of oxide and silicon nitride upon an upper surface of said semiconductor substrate over said first region;

forming a first well impurity distribution in said semiconductor substrate such that a peak concentration of said first well impurity distribution within said first region of said semiconductor substrate is located at a fist well depth below said upper surface and further such that a peak concentration of said first well impurity distribution within said second region of said semiconductor substrate is located at depth approximately equal to said first well depth plus a well displacement;

forming a second well impurity distribution in said semiconductor substrate such that a peak concentration of said second well impurity distribution within said second region of said semiconductor substrate is located at a second well depth at approximately the same elevation as the first well depth and further wherein said patterned dielectric masking layer prevents said second well impurity distribution from substantially entering said first region of said semiconductor substrate;

after said forming the first and second well impurity distributions, and while maintaining the patterned dielectric layer, thermally processing said semiconductor substrate in an inert ambient at a temperature of approximately 700 to 1100° C. for a duration between about 30 minutes and about 700 minutes, wherein said thermally processing provides a substantially uniform vertical doping profile for the first and second well impurity distributions;

after said thermally processing, forming a first adjust impurity distribution in said semiconductor substrate such that a peak concentration of said first adjust impurity distribution within said first region of said semiconductor substrate is located at a first adjust depth below said upper surface of the semiconductor substrate and further such that a peak concentration of said first adjust impurity distribution within said second region of said semiconductor substrate is located at a depth below said upper surface approximately equal to said first adjust depth plus an adjust displacement; and forming a second adjust impurity distribution in said semiconductor substrate such that a peak concentration of said second adjust impurity distribution within said second region of said semiconductor substrate is located at a second adjust depth at approximately the same elevation as the first adjust depth and further wherein said patterned dielectric masking layer prevents said second adjust impurity distribution from substantially entering said second region of said semiconductor substrate.

2. The method of claim 1 wherein the steps of forming said first well impurity distribution, said second well impurity distribution, said first adjust impurity distribution, and said second adjust impurity distribution comprise ion implanting a first well impurity, a second well impurity, a first adjust impurity, and a second adjust impurity at a first well energy, a second well energy, a first adjust energy, and a second adjust energy respectively.

3. The method of claim 2 wherein said first well energy and the said first adjust energy are approximately equal to 0.5 MeV to 3 MeV and further wherein said first well energy is greater than said second well energy and said first adjust energy is greater than said second adjust energy.

4. The method of claim 1, further comprising:

forming a first punchthrough impurity distribution in said semiconductor substrate such that a peak concentration of said first punchthrough impurity distribution within said first region of said semiconductor substrate is located at a first punchthrough depth below said upper surface and further such that a peak concentration of said first punchthrough impurity distribution within said second region of said semiconductor substrate is located at a depth below said upper surface approximately equal to said first punchthrough depth plus a punchthrough displacement; and forming a second punchthrough impurity distribution into said semiconductor substrate such that a peak concentration of said second punchthrough impurity distribution within said second region is located at a second punchthrough depth below said upper surface and further wherein said patterned masking layer prevents said second punchthrough impurity distribution from substantially entering said second region of said semiconductor substrate.

5. The method of claim 4 wherein the step of forming said first punchthrough impurity distribution and said second punchthrough impurity distribution comprise ion implanting a first punchthrough impurity and a second punchthrough impurity at a first punchthrough energy and a second punchthrough energy respectively.

6. The method of claim 4 wherein said first punchthrough energy is approximately equal to 0.5 MeV to 3 MeV, and further wherein said first punchthrough energy is greater than said second punchthrough energy.

7. The method of claim 1 wherein said patterned masking layer comprises photoresist and further wherein a thickness of said patterned masking layer is approximately 0.5 to 5.0 microns.

8. The method of claim 1, wherein said first region of said semiconductor substrate comprises a p-well region and said second region comprises an n-well region.

9. The method of claim 8, wherein said first well impurity comprises boron, said second well impurity comprises phosphorus, said first adjust impurity comprises boron, and said second adjust impurity comprises boron.

* * * * *

UNITED STATES PATENT AND TRADEMARK OFFICE
CERTIFICATE OF CORRECTION

PATENT NO. : 5,985,743
DATED : November 16, 1999
INVENTOR(S) : Mark I. Gardner

It is certified that error appears in the above-identified patent and that said Letters Patent is hereby corrected as shown below:

In the Claims:

Claim 1, col. 13, line 4, please delete "sad" and substitute --said--.

Signed and Sealed this

Twentieth Day of June, 2000

Attest:

Q. TODD DICKINSON

Attesting Officer

Director of Patents and Trademarks